United States Patent
Basu et al.

(10) Patent No.: US 10,628,538 B2
(45) Date of Patent: Apr. 21, 2020

(54) SUGGESTING SENSOR PLACEMENTS FOR IMPROVING EMISSION INVENTORY

(71) Applicant: International Business Machines Corporation, Armonk, NY (US)

(72) Inventors: Saurav Basu, New Delhi (IN); Thomas George, Bangalore (IN); Rashmi Mittal, Uttar Pradesh (IN); Chandrasekar Radhakrishnan, Bangalore (IN); Yogish Sabharwal, Bangalore (IN); Ashish Verma, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 564 days.

(21) Appl. No.: 15/419,135

(22) Filed: Jan. 30, 2017

(65) Prior Publication Data

US 2018/0218095 A1    Aug. 2, 2018

(51) Int. Cl.
G06F 17/50 (2006.01)
G06Q 50/26 (2012.01)
G06F 16/29 (2019.01)

(52) U.S. Cl.
CPC .......... *G06F 17/5009* (2013.01); *G06F 16/29* (2019.01); *G06Q 50/26* (2013.01); *Y02P 90/845* (2015.11)

(58) Field of Classification Search
None
See application file for complete search history.

(56) References Cited

U.S. PATENT DOCUMENTS

2011/0119523 A1 * 5/2011 Bisdikian ............... G06Q 10/04
                                                      714/2

FOREIGN PATENT DOCUMENTS

RU    2397514 C1 *  8/2010

OTHER PUBLICATIONS

Boubrima et al. "Error-Bounded Air Quality Mapping Using Wireless Sensor Networks." LCN 2016—The 41st IEEE Conference on Local Computer Networks, Nov. 2016, 10 pages. (Year: 2016).*

(Continued)

*Primary Examiner* — Suzanne Lo
(74) *Attorney, Agent, or Firm* — Ryan, Mason & Lewis, LLP (57) ABSTRACT

Methods, systems, and computer program products for suggesting sensor placements are provided herein. A method includes simulating the concentration of a pollutant over an area covered by a sensor network grid by applying models to an emission inventory corresponding to the area; computing any discrepancy between the simulated concentration and historical data; applying scaling vectors to the first version to generate scaled versions of the emission inventory; re-simulating the concentration of the pollutant by applying the models to the scaled versions, and computing any discrepancy between the re-simulated concentrations and the historical data; identifying each scaling vector that corresponds with a discrepancy within a pre-determined range; applying the identified scaling vectors to an emission inventory value of each of the grid blocks to generate scaled emission inventory values; determining the grid blocks having high variability within scaled emission inventory values; and suggesting a sensor placement at the determined grid blocks.

20 Claims, 5 Drawing Sheets

(56) References Cited

OTHER PUBLICATIONS

Tolmachev Gennadij Nikolaevich, English translation of RU2397514-C1, Google Patents, 7 pages. (Year: 2010).*
Indhumathi et al., Improving Coverage Deployment for Dynamic Nodes using Genetic Algorithm in Wireless Sensor Networks. Indian Journal of Science and Technology, vol. 8, Jul. 2015, ISSN (Online): 0974-5645.
Kang et al., Detection and Recovery of Coverage Holes in Wireless Sensor Networks. Journal of Networks, vol. 8, No. 4, Apr. 2013.
Koohkan et al., Accounting for representativeness errors in the inversion of atmospheric constituent emissions: Application to the retrieval of regional carbon monoxide fluxes. Tellus B, 64, 19047, 2012.
Zambelli et al., Using spatial multi criteria analysis to design an air quality monitoring network considering source pollutants and receptors. Journal of environmental management, Dec. 17, 2012.
US Environmental Protection Agency, Air Emission Inventories, https://www.epa.gov/air-emissions-inventories, Nov. 16, 2016.
National Center for Atmospheric Research, Atmospheric Chemistry Observations and Modeling, https://www2.acom.ucar.edu/wrf-chem, Sep. 14, 2016.
Community Modeling and Analysis System, CMAQ, https://www.cmascenter.org/cmaq/, May 13, 2016.
Martin, et al., "Global inventory of nitrogen oxide emissions constrained by space-based observations of NO2 columns". Journal of Geophysical Research, vol. 108, No. D17, 4537, doi:10.1029/2003JD003453, 2003.
Henze et al. "Inverse modeling and mapping US air quality influences of inorganic PM 2.5 precursor emissions using the adjoint of GEOS-Chem." Atmospheric Chemistry and Physics 9.16 (2009): 5877-5903.
Henne, Stephan, et al. "Validation of the Swiss methane emission inventory by atmospheric observations and inverse modelling." Atmospheric Chemistry and Physics 16.6 (2016): 3683-3710.
Bergamaschi, P., et al. "Inverse modelling of national and European CH4 emissions using the atmospheric zoom model TM5." Atmospheric Chemistry and Physics 5.9 (2005): 2460.
Hooghiemstra, P. B., et al. "Optimizing global CO emission estimates using a four-dimensional variational data assimilation system and surface network observations." Atmospheric chemistry and physics 11.10 (2011): 4705-4723.
Mendoza-Dominguez et al., "Iterative inverse modeling and direct sensitivity analysis of a photochemical air quality model." Environmental science & technology 34.23 (2000): 4974-4981.
Elbern, H., et al. "Emission rate and chemical state estimation by 4-dimensional variational inversion." Atmospheric Chemistry and Physics 7.14 (2007): 3749-3769.

* cited by examiner

SUGGESTING SENSOR PLACEMENTS FOR IMPROVING EMISSION INVENTORY

FIELD

The present application generally relates to information technology, and, more particularly, to emission grid technology.

BACKGROUND

Emission inventories are utilized for a wide range of environmental measures related to the prevention and/or reduction of air pollution. As used herein, an emissions inventory can include a comprehensive estimate of air emissions of criteria pollutants, criteria precursors, and hazardous air pollutants from air emissions sources. Also, emission inventories are typically prepared by collecting the data from government and/or commercial agencies and blending such data with additional data from one or more other sources that can include demography, energy consumption, vehicle information, etc. Such a process, however, is commonly time-consuming and expensive.

SUMMARY

In one embodiment of the present invention, techniques for suggesting sensor placements for improving emission inventory are provided. An exemplary computer-implemented method can include simulating the concentration of each of one or more pollutants over a given geographic area for a given temporal period, wherein the given geographic area is covered by a sensor network grid, and wherein the simulating step comprises applying one or more pre-determined models to a first version of an emission inventory corresponding to the given geographic area, wherein the emission inventory comprises a pre-determined estimation of the amount of each of the one or more pollutants discharged into the given geographic area within the given temporal period. Such a method can also include computing any discrepancy between the simulated concentration of each of the one or more pollutants and historical data pertaining to the one or more pollutants, and applying multiple scaling vectors to the first version of the emission inventory to generate multiple scaled versions of the emission inventory, wherein each of the scaling vectors comprises a correction factor that is multiplied with the first version of the emission inventory to generate a distinct scaled version of the emission inventory. Additionally, for each of the scaled versions of the emission inventory, such a method can include simulating the concentration of each of the one or more pollutants over the given geographic area for the given temporal period by applying the one or more pre-determined models to the scaled version of the emission inventory, and computing any discrepancy between the simulated concentration of each of the one or more pollutants and the historical data. Further, such a method can include identifying each of the scaling vectors that corresponds with a discrepancy that is within a pre-determined range, and applying the identified scaling vectors to an emission inventory value attributed to each of multiple grid blocks within the sensor network grid, to generate a set of scaled emission inventory values for each of the multiple grid blocks. Also, such a method can include determining one or more of the grid blocks having greater variability within its set of scaled emission inventory values, relative to the other grid blocks, wherein greater variability within a set of scaled emission inventory values corresponds to less confidence in the set of scaled emission inventory values, and outputting a sensor placement suggestion to a user, wherein the sensor placement suggestion identifies each of the one or more determined grid blocks as a candidate for placement of a sensor to increase emission inventory accuracy for the given geographic area.

In another embodiment of the invention, an exemplary computer-implemented method can include applying a coupled set of pre-determined models via using a weather conditions model to estimate one or more weather conditions at one or more locations of the given geographic area during the given temporal period, and using a chemical transport model to estimate the dispersion of each of the one or more pollutants within the given geographic area based on (i) the first version of the emission inventory and (ii) the estimated weather conditions. Additionally, such a method can include, for each of the grid blocks, determining the variability within its set of scaled emission inventory values, wherein greater variability within a set of scaled emission inventory values corresponds to less confidence in the set of scaled emission inventory values. Further, such a method can include ranking the grid blocks, in descending order, by amount of variability, and outputting a sensor placement suggestion to a user, wherein the sensor placement suggestion identifies each of the one or more highest-ranked grid blocks as a candidate for placement of a sensor to increase emission inventory accuracy for the given geographic area.

Another embodiment of the invention or elements thereof can be implemented in the form of a computer program product tangibly embodying computer readable instructions which, when implemented, cause a computer to carry out a plurality of method steps, as described herein. Furthermore, another embodiment of the invention or elements thereof can be implemented in the form of a system including a memory and at least one processor that is coupled to the memory and configured to perform noted method steps. Yet further, another embodiment of the invention or elements thereof can be implemented in the form of means for carrying out the method steps described herein, or elements thereof; the means can include hardware module(s) or a combination of hardware and software modules, wherein the software modules are stored in a tangible computer-readable storage medium (or multiple such media).

These and other objects, features and advantages of the present invention will become apparent from the following detailed description of illustrative embodiments thereof, which is to be read in connection with the accompanying drawings.

DETAILED DESCRIPTION

As described herein, an embodiment of the present invention includes suggesting sensor placements for improving the confidence in a calculated emission inventory. As also detailed herein, air pollution sensor networks can provide real-time information regarding the ambient air pollution concentration that results from transformation of emitted pollutants through various physical and chemical processes. Using such sensors, one or more embodiments of the invention can include estimating shortcomings in the identifiability of a given inventory and improving confidence in the calculated inventory based on any identified shortcomings.

At least one embodiment of the invention includes recommending and/or suggesting a placement and/or location of one or more sensors to be added to a sensor network to improve the confidence in the corresponding estimated emission inventory. Further, such an embodiment can include identifying an emission grid with high sensitivity with respect to the degree of mismatch between the observed and simulated results (in connection with pollution data), and proposing ways to reduce the sensitivity at the grid points with high values via suggesting that location for sensor placement.

Accordingly, one or more embodiments of the invention can include identifying optimal sensor locations to reduce uncertainty in the estimation of an emission inventory. Such an embodiment includes measuring uncertainties in the estimation of the underlying physical model inputs such as an emission inventory. Instead of reconstructing the emission inventory, at least one embodiment of the invention can include measuring the uncertainty in estimating the emission inventory given the current observed pollutants and their mismatch with simulated pollutants. A resulting output of such an embodiment can include, for example, a suggestion of one or more locations with maximum uncertainty where the new placement of one or more sensors will improve the confidence of the emission inventory estimation.

As such, one or more embodiments of the invention can include utilizing inputs of a base emission inventory, which can include gridded emission values of one or more criteria pollutants, a base air quality sensor network, and one or more constraints on the choice of new sensor location(s), such as no-construction zones or militarily sensitive areas. Based on such inputs, at least one embodiment of the invention can include generating an output of a sensor placement recommendation that improves the confidence of the estimated emission inventory. Further, as detailed herein, based on a historical matching technique, at least one embodiment of the invention can include identifying emission grids with high sensitivity with respect to the degree of mismatch between observed and simulated pollutants (if the base inventory is time-varying).

Figure 1:
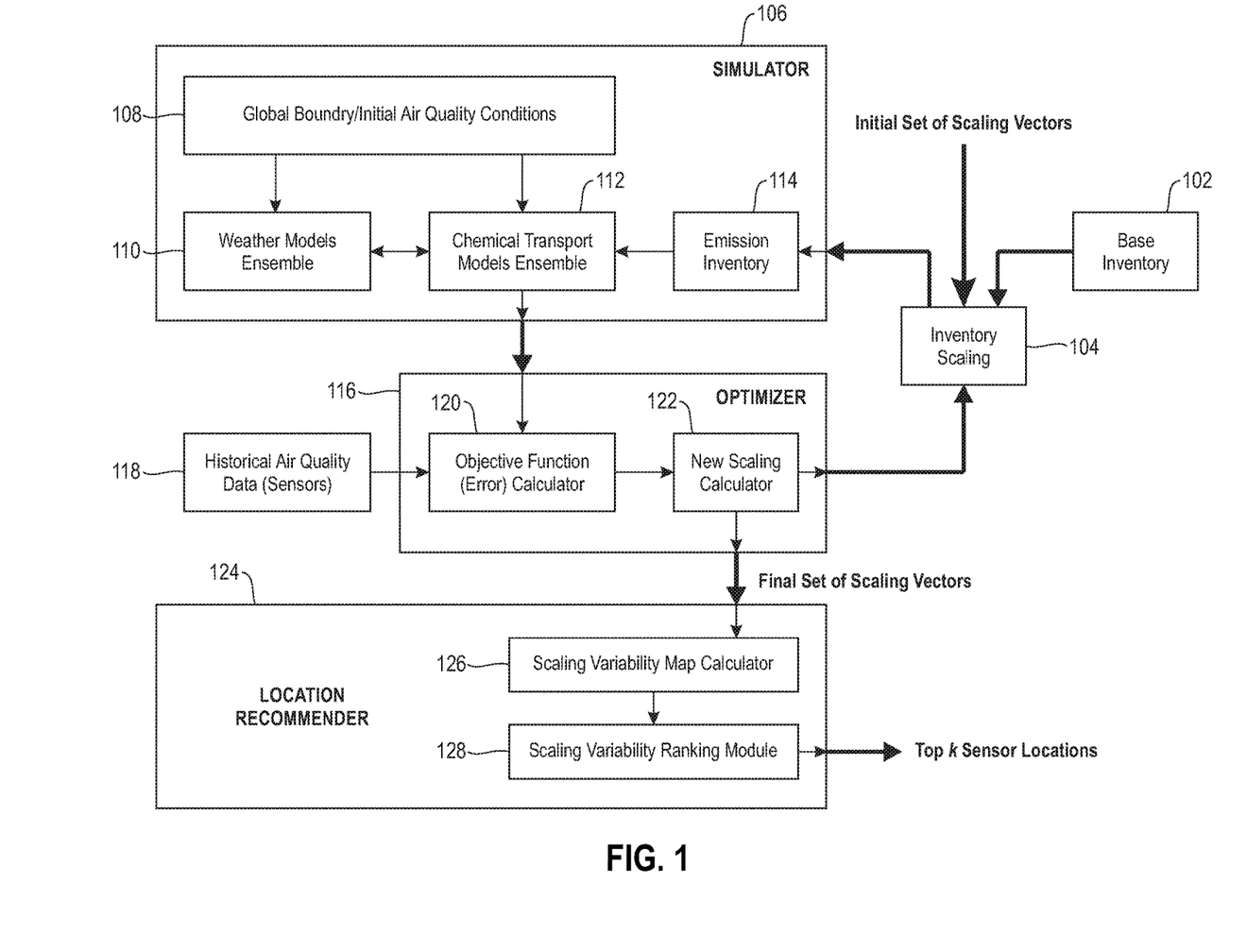
FIG. 1 is a diagram illustrating system architecture, according to an exemplary embodiment of the invention.

FIG. 1 is a diagram illustrating system architecture, according to an embodiment of the invention. By way of illustration, FIG. 1 depicts a base inventory 102, which, along with an initial set of scaling vectors, is provided to an inventory scaling module 104, which is a module that uses new scales for an emission inventory suggested by an optimizer 116 (as described below) and computes a scaled inventory. As used herein, scaling vectors refer to correction factors that are multiplied with the base inventory to arrive at an optimal inventory. Accordingly, a base inventory can be scaled via one or more embodiments of the invention to arrive at an optimal inventory, and this scaling can be carried out multiple times by running the minimization of mismatch process multiple times. The inventory scaling module 104 provides a scaled inventory as input to a simulator 106, which takes an emission inventory 114 and global air quality data 108 from the provided input and computes the pollutant concentration in space and time using a coupled system of a weather model ensemble 110 and a chemical transport model ensemble 112.

In at least one embodiment of the invention, the coupled weather-chemistry model can calculate the weather conditions (such as temperature and wind speed) at the various grid points over a specified period of time, starting from an initial known state of the conditions at a previous time. The chemical transport model 112 receives the weather conditions at the specified period as input from the weather model 110, applies chemical transport principles to calculate the dispersion of pollutants from an emission inventory based on the supplied weather conditions, and adds the effect of pollution on the weather parameters.

The simulator 106 then provides the computed pollutant concentration to an optimizer 116, which also receives historical air quality (sensor) data 118. The optimizer 116 computes the error in the provided concentration values via the use of simulator values with respect to observed data using an objective function calculator 120. In one or more embodiments of the invention, the error can be computed in multiple ways. For example, the error can be computed as being a sum of squared differences between the observed pollution values and the simulated pollution values, the sum being taken over the entire period of observation and over all observed stations. Additionally, the optimizer 116 considers different scaling values for the emission inventory and computes the minima of the error function to suggest a new set of emission scales using a new scaling calculator 122. The minima of the error function can be obtained with the help of one or more optimization software programs, wherein the input to the error function required by the software would be the scaling values, and the output of the objective function would be the value of the error. Based on this computation, the optimizer 116 provides a final set of scaling vectors to a location recommender 124 (as well as to the inventory scaling module 104).

In one or more embodiments of the invention, the simulator 106, the optimizer 116 and the inventory scaling module 104 are implemented iteratively to obtain the minima in the error. Further, as noted above, the location recommender 124 takes all possible emission inventory scales that produce the error in the objective function (within a permissible range) and computes the variability map via calculator 126. In at least one embodiment of the invention, multiple runs of the error minimization process carried out via optimization software can lead to different final values of the scaling after each minimization, wherein each scale corresponds to a specific area of the emission grid. The area with the highest variability of the final scaling value to that particular area across all of the runs of the minimization process would signify low confidence on the estimatibility of the scale value at that area. The map can, for example, be represented via a grayscale image over the emission grid, with brighter values signifying higher variability (lesser confidence) and darker values signifying lower variability (higher confidence) in the emission inventory estimation process.

The location recommender 124 further ranks the variations, via module 128, in descending order and uses the ranking to recommend the new location for one or more sensors (for example, by outputting the top k sensor locations).

Accordingly, as depicted in FIG. 1, and as detailed above, at least one embodiment of the invention can include beginning via the simulator 106 computing the concentration of pollutants using coupled weather-chemistry transport models (110 and 112, respectively). In such a step, the simulator 106 uses the base inventory 102 and global air quality data 108 as inputs. Subsequently, in such an embodiment, the optimizer 116 takes the output of the simulator 106 and computes the error in the simulated concentrations with respect to the observations. The optimizer 116 increments the base emission scale values in positive and negative directions, and the resulting scale vector is used to scale the base inventory 102, which is then used in the simulator 106 to compute new concentration values. In this manner, the concentration values are computed with all resulting emission scaling factors, and a local minimum is chosen by the optimizer 116.

Further, in one or more embodiments of the invention, the process detailed in the above paragraph is repeated until the solution converges. Additionally, the process can be repeated to search for all possible scaling factors that meet given convergence criteria. Also, the set of converged scaling factors can be used to recommend the new locations of one or more sensors. In such an embodiment, a new sensor location can be recommended by computing the variability map of the scaling factors. Further, the scale factors can be ranked, in descending order of their variance, to recommend the new locations for one or more sensors.

Figure 2:
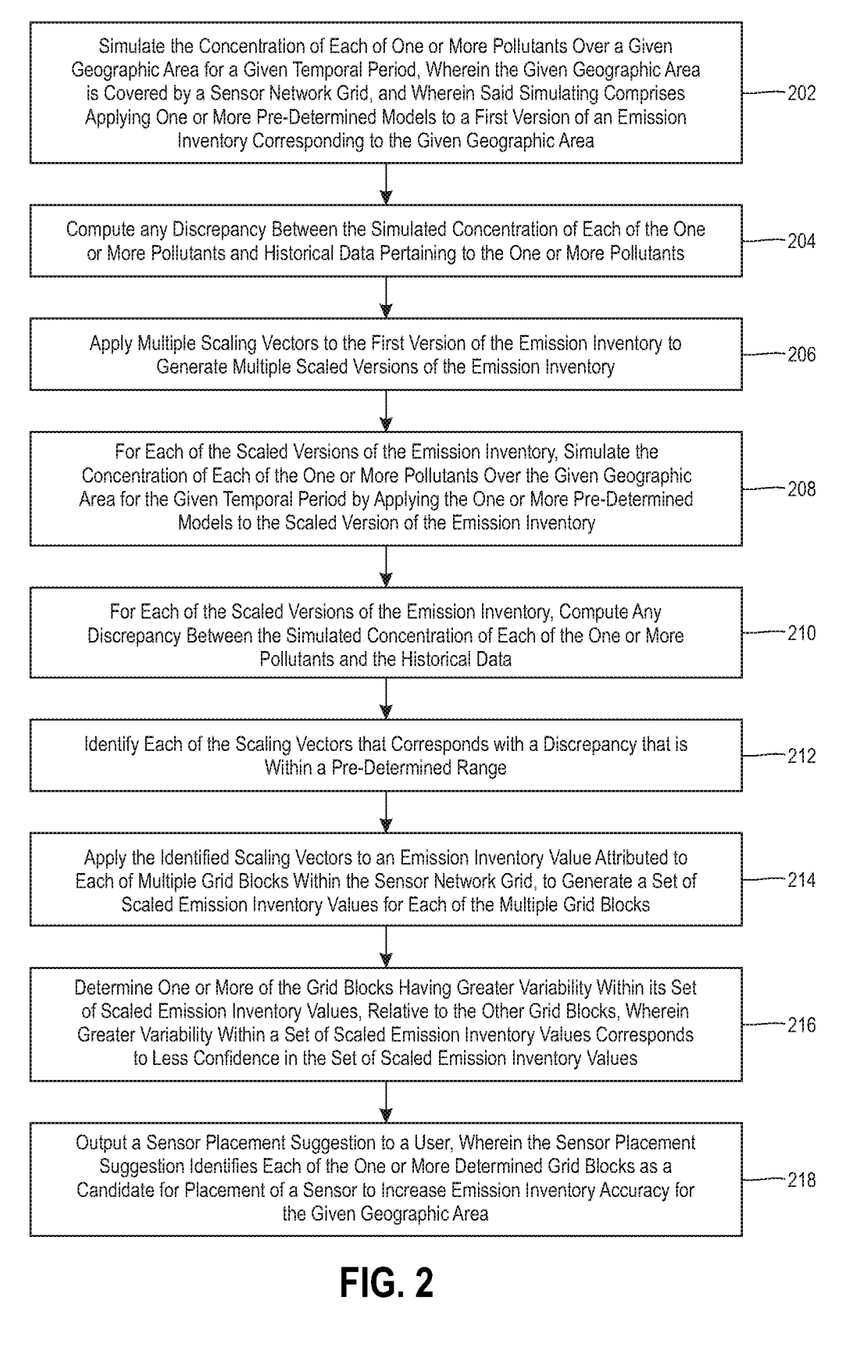
FIG. 2 is a flow diagram illustrating techniques, according to an embodiment of the invention.

FIG. 2 is a flow diagram illustrating techniques according to an embodiment of the present invention. Step 202 includes simulating the concentration of each of one or more pollutants over a given geographic area for a given temporal period, wherein the given geographic area is covered by a sensor network grid, and wherein said simulating comprises applying one or more pre-determined models to a first version of an emission inventory corresponding to the given geographic area, wherein the emission inventory comprises a pre-determined estimation of the amount of each of the one or more pollutants discharged into the given geographic area within the given temporal period. The one or more pre-determined models can include one or more weather-related models (such as a temperature model and/or a wind speed model) and/or one or more chemistry transport models.

Step 204 includes computing any discrepancy between the simulated concentration of each of the one or more pollutants and historical data pertaining to the one or more pollutants. Step 206 includes applying multiple scaling vectors to the first version of the emission inventory to generate multiple scaled versions of the emission inventory, wherein each of the scaling vectors comprises a correction factor that is multiplied with the first version of the emission inventory to generate a distinct scaled version of the emission inventory.

Step 208 includes, for each of the scaled versions of the emission inventory, simulating the concentration of each of the one or more pollutants over the given geographic area for the given temporal period by applying the one or more pre-determined models to the scaled version of the emission inventory. Step 210 includes, for each of the scaled versions of the emission inventory, computing any discrepancy between the simulated concentration of each of the one or more pollutants and the historical data.

Step 212 includes identifying each of the scaling vectors that corresponds with a discrepancy that is within a pre-determined range. Step 214 includes applying the identified scaling vectors to an emission inventory value attributed to each of multiple grid blocks within the sensor network grid, to generate a set of scaled emission inventory values for each of the multiple grid blocks.

Step 216 includes determining one or more of the grid blocks having greater variability within its set of scaled emission inventory values, relative to the other grid blocks, wherein greater variability within a set of scaled emission inventory values corresponds to less confidence in the set of scaled emission inventory values. Step 218 includes outputting a sensor placement suggestion to a user, wherein the sensor placement suggestion identifies each of the one or more determined grid blocks as a candidate for placement of a sensor to increase emission inventory accuracy for the given geographic area. The sensor placement suggestion can include a suggestion to add an additional sensor at each of the one or more determined grid blocks and/or a suggestion to reposition an existing sensor to each of the one or more determined grid blocks.

Additionally, the techniques depicted in FIG. 2 can also include filtering the one or more determined grid blocks based on one or more constraints pertaining to sensor location within the given geographic area, wherein the constraints can include one or more no-construction zones within the given geographic area, one or more pre-determined sensitive areas within the given geographic area, etc. Additionally, at least one embodiment of the invention can include generating a variability map for the a sensor network grid based on the generated set of scaled emission inventory values attributed to each of the multiple grid blocks, and ranking the identified scaling vectors, in descending order of their variance, based on the generated variability map.

Also, an additional embodiment of the invention includes applying a coupled set of pre-determined models via using a weather conditions model to estimate one or more weather conditions at one or more locations of the given geographic area during the given temporal period, and using a chemical transport model to estimate the dispersion of each of the one or more pollutants within the given geographic area based on (i) the first version of the emission inventory and (ii) the estimated weather conditions. Additionally, such an embodiment can include, for each of the grid blocks, determining the variability within its set of scaled emission inventory values, wherein greater variability within a set of scaled emission inventory values corresponds to less confidence in the set of scaled emission inventory values. Further, such an embodiment can include ranking the grid blocks, in descending order, by amount of variability, and outputting a sensor placement suggestion to a user, wherein the sensor placement suggestion identifies each of the one or more highest-ranked grid blocks as a candidate for placement of a sensor to increase emission inventory accuracy for the given geographic area.

By way merely of example, an exemplary implementation of one or more embodiments of the invention can include finding new locations for PM2.5 sensors in a given geographic region of interest wherein the effect of variations in an emission inventory are not reflected in the simulation of PM2.5 sensors at the pre-existing sensor locations. In such an example implementation, a pre-existing emission inventory (for example, EDGAR-HTAP, INTEX-B) may be present. Additionally, such an embodiment can include dividing the region of interest into a rectangular grid (for example, with two kilometer (km) by two km grid spacing, resulting in 100×120 grid points). Subsequently, a combination of scale factors corresponding to each box inside the grid (for example, the top 10 grid rows have scales 10 times the original inventory, and the remaining grid boxes are unchanged) can be used to scale the base inventory and then used to obtain simulations of PM2.5 sensors at the sensor locations via running a coupled weather-air quality model. After systematic sequential trials, an optimizer determines the optimal grid scale factors that minimize the error of PM2.5 estimates at the pre-existing sensor locations. Also, the process can be repeated with a set of initial scale factors, and corresponding optimal scales can be computed. Further, the recommender looks at the variations of these optimal scale factors for each grid box, and the grid boxes are ranked according to the descending order of these variations. The top few (for example, the top k) locations are considered as the locations that are insensitive to the refinement of the emission inventory with respect to the current sensor network, and are the probable optimal locations for the placement of new sensors.

At least one embodiment of the invention (such as the techniques depicted in FIG. 2, for example), can include implementing a service via a transmission server to receive data from a data source and send selected data to users (for example, at a provided destination address of a wireless device (such as a number for a cellular phone, etc.)). The transmission server includes a memory, a transmitter, and a microprocessor. Such an embodiment of the invention can also include providing a viewer application to the users for installation on their individual devices. Additionally, in such an embodiment of the invention, after a user enrolls, the service receives base inventory information sent from a data source to the transmission server. The server can process the information, for example, based upon user-provided user preference information that is stored in memory on the server. Subsequently, an alert is generated containing one or more sensor placement suggestions. The alert can be formatted into data blocks, for example, based upon any provided alert format preference information. Subsequently, the alert and/or formatted data blocks are transmitted over a data channel to the user's wireless device. After receiving the alert, the user can connect the wireless device to the user's computer, whereby the alert causes the user's computer to automatically launch the application provided by the service to display the alert. When connected to the Internet, the user may then use the viewer application (for example, via clicking on a URL associated with the data source provided in the alert) to facilitate a connection from the remote user computer to the data source over the Internet for additional information.

The techniques depicted in FIG. 2 can also, as described herein, include providing a system, wherein the system includes distinct software modules, each of the distinct software modules being embodied on a tangible computer-readable recordable storage medium. All of the modules (or any subset thereof) can be on the same medium, or each can be on a different medium, for example. The modules can include any or all of the components shown in the figures and/or described herein. In an embodiment of the invention, the modules can run, for example, on a hardware processor. The method steps can then be carried out using the distinct software modules of the system, as described above, executing on a hardware processor. Further, a computer program product can include a tangible computer-readable recordable storage medium with code adapted to be executed to carry out at least one method step described herein, including the provision of the system with the distinct software modules.

Additionally, the techniques depicted in FIG. 2 can be implemented via a computer program product that can include computer useable program code that is stored in a computer readable storage medium in a data processing system, and wherein the computer useable program code was downloaded over a network from a remote data processing system. Also, in an embodiment of the invention, the computer program product can include computer useable program code that is stored in a computer readable storage medium in a server data processing system, and wherein the computer useable program code is downloaded over a network to a remote data processing system for use in a computer readable storage medium with the remote system.

An embodiment of the invention or elements thereof can be implemented in the form of an apparatus including a memory and at least one processor that is coupled to the memory and configured to perform exemplary method steps.

Figure 3:
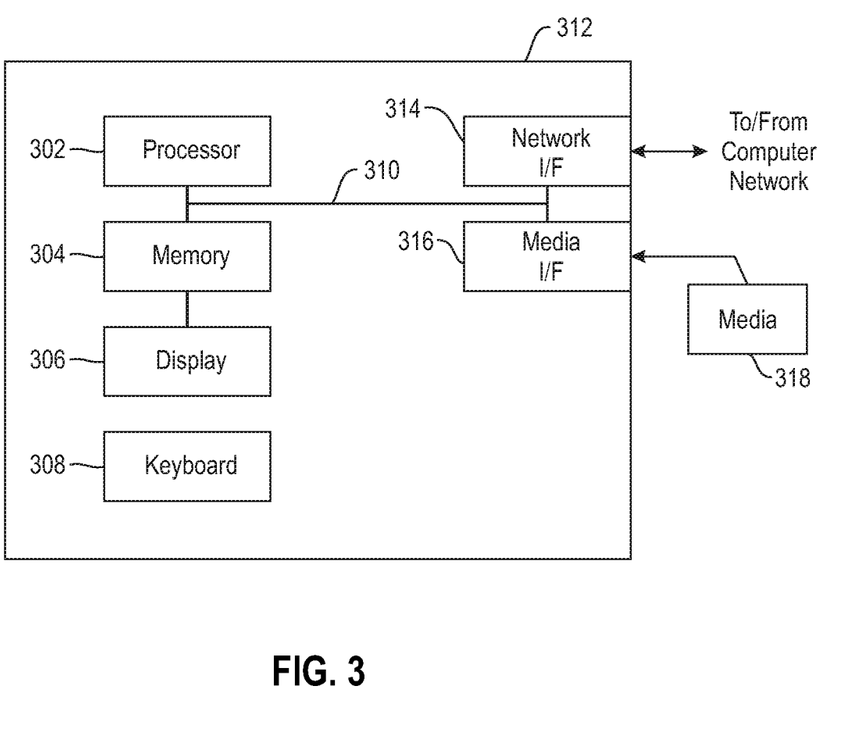
FIG. 3 is a system diagram of an exemplary computer system on which at least one embodiment of the invention can be implemented.

Additionally, an embodiment of the present invention can make use of software running on a computer or workstation. With reference to FIG. 3, such an implementation might employ, for example, a processor 302, a memory 304, and an input/output interface formed, for example, by a display 306 and a keyboard 308. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, a mechanism for inputting data to the processing unit (for example, mouse), and a mechanism for providing results associated with the processing unit (for example, printer). The processor 302, memory 304, and input/output interface such as display 306 and keyboard 308 can be interconnected, for example, via bus 310 as part of a data processing unit 312. Suitable interconnections, for example via bus 310, can also be provided to a network interface 314, such as a network card, which can be provided to interface with a computer network, and to a media interface 316, such as a diskette or CD-ROM drive, which can be provided to interface with media 318.

Accordingly, computer software including instructions or code for performing the methodologies of the invention, as described herein, may be stored in associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 302 coupled directly or indirectly to memory elements 304 through a system bus 310. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including, but not limited to, keyboards 308, displays 306, pointing devices, and the like) can be coupled to the system either directly (such as via bus 310) or through intervening I/O controllers (omitted for clarity).

Network adapters such as network interface 314 may also be coupled to the system to enable the data processing system to become coupled to other data processing systems or remote printers or storage devices through intervening private or public networks. Modems, cable modems and Ethernet cards are just a few of the currently available types of network adapters.

As used herein, including the claims, a "server" includes a physical data processing system (for example, system 312 as shown in FIG. 3) running a server program. It will be understood that such a physical server may or may not include a display and keyboard.

The present invention may be a system, a method, and/or a computer program product at any possible technical detail level of integration. The computer program product may include a computer readable storage medium (or media) having computer readable program instructions thereon for causing a processor to carry out embodiments of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform embodiments of the present invention.

Embodiments of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that any of the methods described herein can include an additional step of providing a system comprising distinct software modules embodied on a computer readable storage medium; the modules can include, for example, any or all of the components detailed herein. The method steps can then be carried out using the distinct software modules and/or sub-modules of the system, as described above, executing on a hardware processor 302. Further, a computer program product can include a computer-readable storage medium with code adapted to be implemented to carry out at least one method step described herein, including the provision of the system with the distinct software modules.

In any case, it should be understood that the components illustrated herein may be implemented in various forms of hardware, software, or combinations thereof, for example, application specific integrated circuit(s) (ASICS), functional circuitry, an appropriately programmed digital computer with associated memory, and the like. Given the teachings of the invention provided herein, one of ordinary skill in the related art will be able to contemplate other implementations of the components of the invention.

Additionally, it is understood in advance that implementation of the teachings recited herein are not limited to a particular computing environment. Rather, embodiments of the present invention are capable of being implemented in conjunction with any type of computing environment now known or later developed.

For example, cloud computing is a model of service delivery for enabling convenient, on-demand network access to a shared pool of configurable computing resources (for example, networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (for example, country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (for example, storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (for example, web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (for example, host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (for example, mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (for example, cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 4:
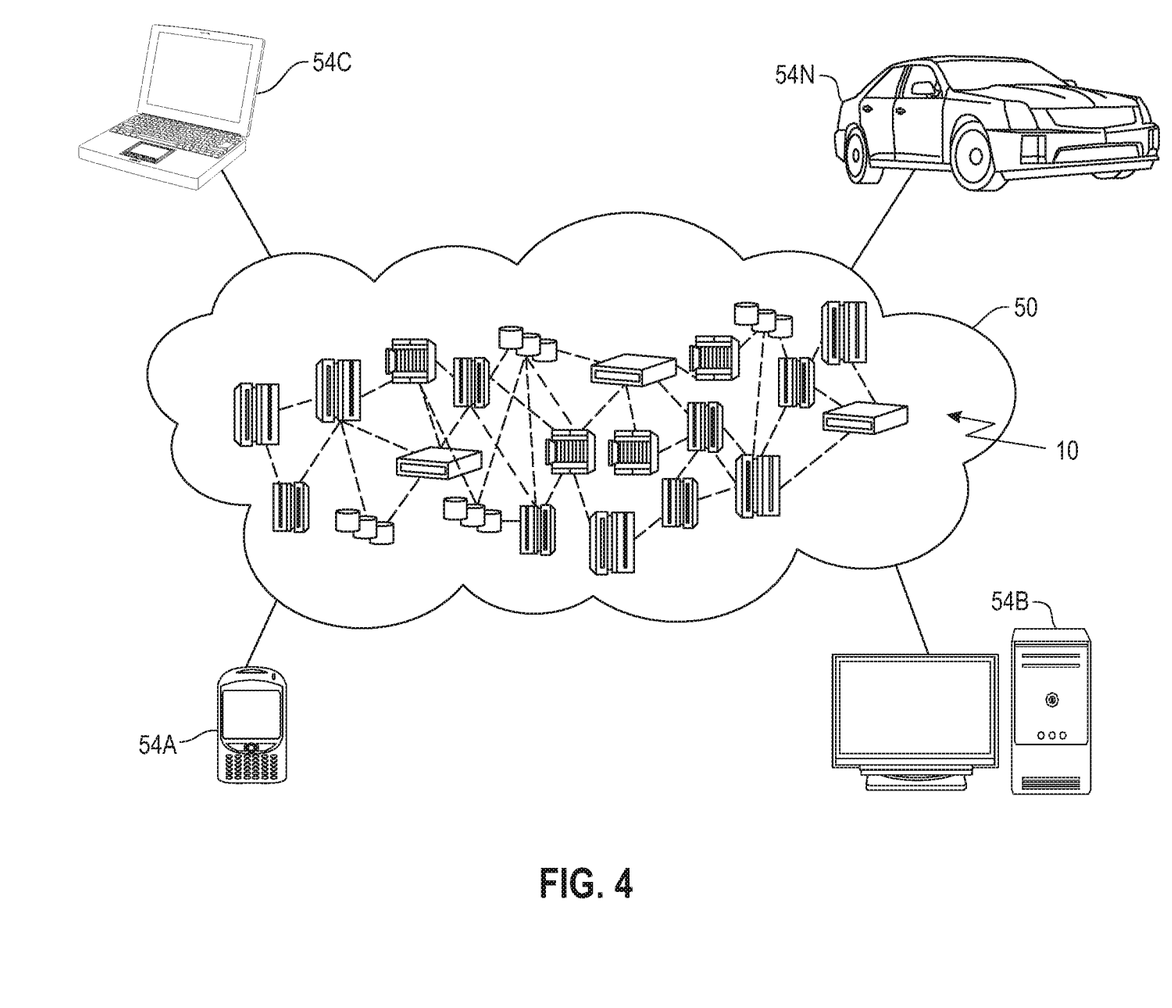
FIG. 4 depicts a cloud computing environment according to an embodiment of the present invention.

Referring now to FIG. 4, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 4 are intended to be illustrative only and that computing nodes 10 and cloud computing environment 50 can communicate with any type of computerized device over any type of network and/or network addressable connection (e.g., using a web browser).

Figure 5:
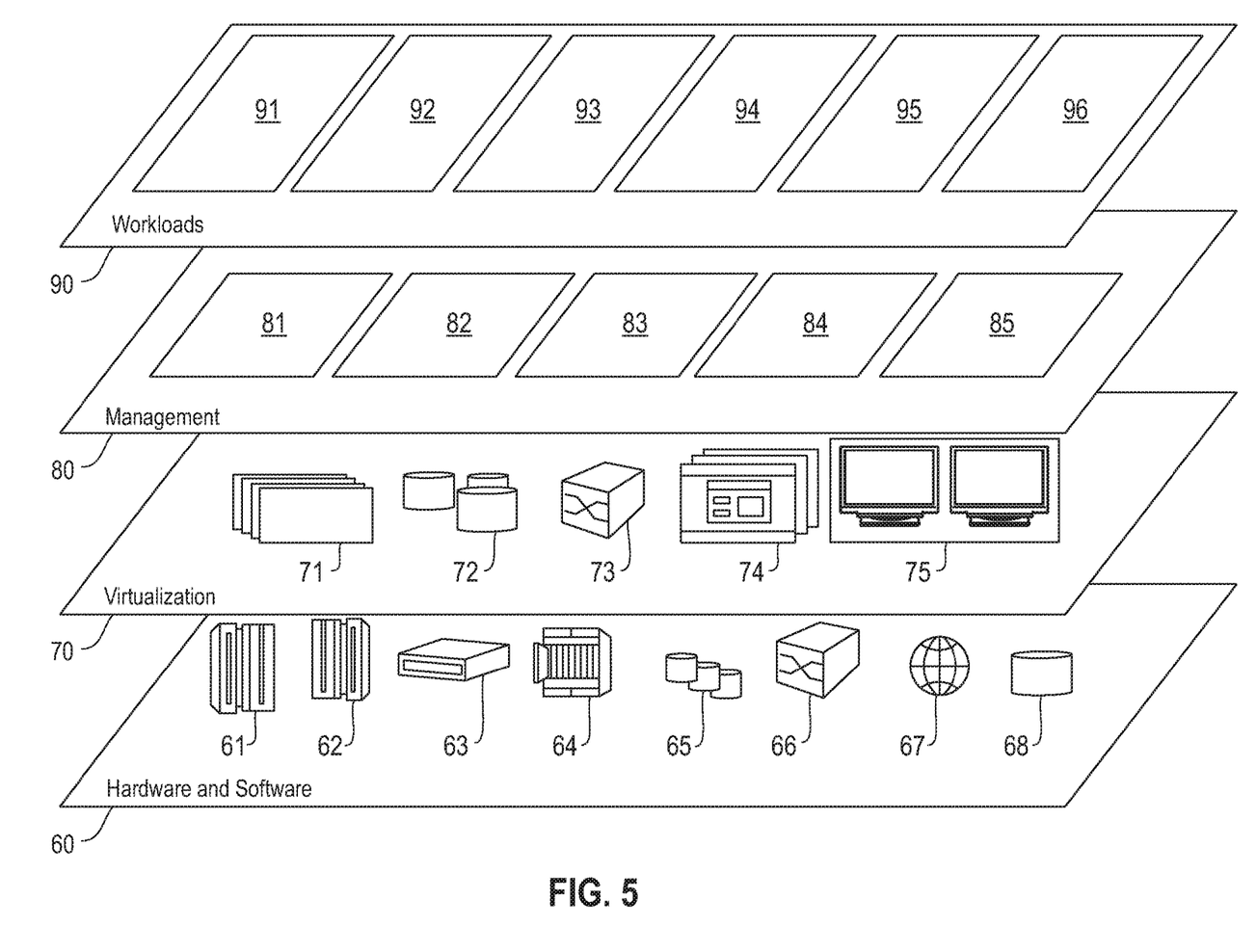
FIG. 5 depicts abstraction model layers, according to an embodiment of the present invention.

Referring now to FIG. 5, a set of functional abstraction layers provided by cloud computing environment 50 (FIG. 4) is shown. It should be understood in advance that the components, layers, and functions shown in FIG. 5 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75. In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources.

In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and sensor placement determining 96, in accordance with the one or more embodiments of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of another feature, step, operation, element, component, and/or group thereof.

At least one embodiment of the present invention may provide a beneficial effect such as, for example, identifying an emission grid with low sensitivity with respect to the degree of mismatch between observed and simulated results (pertaining to pollution data).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
simulating the concentration of each of one or more pollutants over a given geographic area for a given temporal period, wherein the given geographic area is covered by a sensor network grid, and wherein said simulating comprises applying one or more pre-determined models to a first version of an emission inventory corresponding to the given geographic area, wherein the emission inventory comprises a pre-determined estimation of the amount of each of the one or more pollutants discharged into the given geographic area within the given temporal period;
computing any discrepancy between the simulated concentration of each of the one or more pollutants and historical data pertaining to the one or more pollutants;
applying multiple scaling vectors to the first version of the emission inventory to generate multiple scaled versions of the emission inventory, wherein each of the scaling vectors comprises a correction factor that is multiplied with the first version of the emission inventory to generate a distinct scaled version of the emission inventory;
for each of the scaled versions of the emission inventory, simulating the concentration of each of the one or more pollutants over the given geographic area for the given temporal period by applying the one or more pre-determined models to the scaled version of the emission inventory;
for each of the scaled versions of the emission inventory, computing any discrepancy between the simulated concentration of each of the one or more pollutants and the historical data;
identifying each of the scaling vectors that corresponds with a discrepancy that is within a pre-determined range;
applying the identified scaling vectors to an emission inventory value attributed to each of multiple grid blocks within the sensor network grid, to generate a set of scaled emission inventory values for each of the multiple grid blocks;
determining one or more of the grid blocks having greater scaled emission inventory value variability within relative to the other grid blocks, wherein greater scaled emission inventory value variability corresponds to less confidence in a respective set of scaled emission inventory values; and outputting a sensor placement suggestion to a user, wherein the sensor placement suggestion identifies each of the one or more determined grid blocks as a candidate for placement of a sensor to increase emission inventory accuracy for the given geographic area;

wherein the method is carried out by at least one computing device.

2. The computer-implemented method of claim 1, wherein the one or more pre-determined models comprise one or more weather-related models.

3. The computer-implemented method of claim 2, wherein the one or more weather-related models comprises a temperature model.

4. The computer-implemented method of claim 2, wherein the one or more weather-related models comprises a wind speed model.

5. The computer-implemented method of claim 1, wherein the one or more pre-determined models comprise one or more chemistry transport models.

6. The computer-implemented method of claim 1, wherein the one or more pre-determined models comprise one or more weather-related models and one or more chemistry transport models.

7. The computer-implemented method of claim 1, comprising:
    filtering the one or more determined grid blocks based on one or more constraints pertaining to sensor location within the given geographic area.

8. The computer-implemented method of claim 7, wherein said one or more constraints comprises one or more no-construction zones within the given geographic area.

9. The computer-implemented method of claim 7, wherein said one or more constraints comprises one or more pre-determined sensitive areas within the given geographic area.

10. The computer-implemented method of claim 1, comprising:
    generating a variability map for the sensor network grid based on the generated set of scaled emission inventory values attributed to each of the multiple grid blocks.

11. The computer-implemented method of claim 10, comprising:
    ranking the identified scaling vectors, in descending order of their variance, based on the generated variability map.

12. The computer-implemented method of claim 1, wherein the sensor placement suggestion comprises a suggestion to add an additional sensor at each of the one or more determined grid blocks.

13. The computer-implemented method of claim 1, wherein the sensor placement suggestion comprises a suggestion to reposition an existing sensor to each of the one or more determined grid blocks.

14. A computer program product comprising a computer readable storage medium having program instructions embodied therewith, the program instructions executable by a device to cause the device to:
    simulate the concentration of each of one or more pollutants over a given geographic area for a given temporal period, wherein the given geographic area is covered by a sensor network grid, and wherein said simulating comprises applying one or more pre-determined models to a first version of an emission inventory corresponding to the given geographic area, wherein the emission inventory comprises a pre-determined estimation of the amount of each of the one or more pollutants discharged into the given geographic area within the given temporal period;

compute any discrepancy between the simulated concentration of each of the one or more pollutants and historical data pertaining to the one or more pollutants;

apply multiple scaling vectors to the first version of the emission inventory to generate multiple scaled versions of the emission inventory, wherein each of the scaling vectors comprises a correction factor that is multiplied with the first version of the emission inventory to generate a distinct scaled version of the emission inventory;

for each of the scaled versions of the emission inventory, simulate the concentration of each of the one or more pollutants over the given geographic area for the given temporal period by applying the one or more pre-determined models to the scaled version of the emission inventory;

for each of the scaled versions of the emission inventory, compute any discrepancy between the simulated concentration of each of the one or more pollutants and the historical data;

identify each of the scaling vectors that corresponds with a discrepancy that is within a pre-determined range;

apply the identified scaling vectors to an emission inventory value attributed to each of multiple grid blocks within the sensor network grid, to generate a set of scaled emission inventory values for each of the multiple grid blocks;

determine one or more of the grid blocks having greater scaled emission inventory value variability within relative to the other grid blocks, wherein greater scaled emission inventory value variability corresponds to less confidence in a respective set of scaled emission inventory values; and output a sensor placement suggestion to a user, wherein the sensor placement suggestion identifies each of the one or more determined grid blocks as a candidate for placement of a sensor to increase emission inventory accuracy for the given geographic area.

15. The computer program product of claim 14, wherein the one or more pre-determined models comprise one or more weather-related models and one or more chemistry transport models.

16. The computer program product of claim 14, wherein the program instructions executable by a computing device further cause the computing device to:
    filter the one or more determined grid blocks based on one or more constraints pertaining to sensor location within the given geographic area.

17. The computer program product of claim 14, wherein the program instructions executable by a computing device further cause the computing device to:
    generate a variability map for the sensor network grid based on the generated set of scaled emission inventory values attributed to each of the multiple grid blocks.

18. The computer program product of claim 17, wherein the program instructions executable by a computing device further cause the computing device to:
    rank the identified scaling vectors, in descending order of their variance, based on the generated variability map.

19. A system comprising:
    a memory; and
    at least one processor operably coupled to the memory and configured for to perform the steps of:

simulating the concentration of each of one or more pollutants over a given geographic area for a given temporal period, wherein the given geographic area is covered by a sensor network grid, and wherein said simulating comprises applying one or more pre-determined models to a first version of an emission inventory corresponding to the given geographic area, wherein the emission inventory comprises a pre-determined estimation of the amount of each of the one or more pollutants discharged into the given geographic area within the given temporal period;

computing any discrepancy between the simulated concentration of each of the one or more pollutants and historical data pertaining to the one or more pollutants;

applying multiple scaling vectors to the first version of the emission inventory to generate multiple scaled versions of the emission inventory, wherein each of the scaling vectors comprises a correction factor that is multiplied with the first version of the emission inventory to generate a distinct scaled version of the emission inventory;

for each of the scaled versions of the emission inventory, simulating the concentration of each of the one or more pollutants over the given geographic area for the given temporal period by applying the one or more pre-determined models to the scaled version of the emission inventory;

for each of the scaled versions of the emission inventory, computing any discrepancy between the simulated concentration of each of the one or more pollutants and the historical data;

identifying each of the scaling vectors that corresponds with a discrepancy that is within a pre-determined range;

applying the identified scaling vectors to an emission inventory value attributed to each of multiple grid blocks within the sensor network grid, to generate a set of scaled emission inventory values for each of the multiple grid blocks;

determining one or more of the grid blocks having greater scaled emission inventory value variability within relative to the other grid blocks, wherein greater scaled emission inventory value variability corresponds to less confidence in a respective set of scaled emission inventory values; and outputting a sensor placement suggestion to a user, wherein the sensor placement suggestion identifies each of the one or more determined grid blocks as a candidate for placement of a sensor to increase emission inventory accuracy for the given geographic area.

20. A computer-implemented method, comprising:

simulating the concentration of each of one or more pollutants over a given geographic area for a given temporal period, wherein the given geographic area is covered by a sensor network grid, and wherein said simulating comprises applying a coupled set of pre-determined models to a first version of an emission inventory corresponding to the given geographic area, wherein the emission inventory comprises a pre-determined estimation of the amount of each of the one or more pollutants discharged into the given geographic area within the given temporal period, and wherein said applying the coupled set of pre-determined models comprises:
    using a weather conditions model to estimate one or more weather conditions at one or more locations of the given geographic area during the given temporal period; and
    using a chemical transport model to estimate the dispersion of each of the one or more pollutants within the given geographic area based on (i) the first version of the emission inventory and (ii) the estimated weather conditions;

computing any discrepancy between the simulated concentration of each of the one or more pollutants and historical data pertaining to the one or more pollutants;

applying multiple scaling vectors to the first version of the emission inventory to generate multiple scaled versions of the emission inventory, wherein each of the scaling vectors comprises a correction factor that is multiplied with the first version of the emission inventory to generate a distinct scaled version of the emission inventory;

for each of the scaled versions of the emission inventory, simulating the concentration of each of the one or more pollutants over the given geographic area for the given temporal period by applying the one or more pre-determined models to the scaled version of the emission inventory;

for each of the scaled versions of the emission inventory, computing any discrepancy between the simulated concentration of each of the one or more pollutants and the historical data;

identifying each of the scaling vectors that corresponds with a discrepancy that is within a pre-determined range;

applying the identified scaling vectors to an emission inventory value attributed to each of multiple grid blocks within the sensor network grid, to generate a set of scaled emission inventory values for each of the multiple grid blocks;

for each of the grid blocks, determining the variability within its set of scaled emission inventory values, wherein greater variability within a set of scaled emission inventory values corresponds to less confidence in the set of scaled emission inventory values;

ranking the grid blocks, in descending order, by amount of variability; and outputting a sensor placement suggestion to a user, wherein the sensor placement suggestion identifies each of the one or more highest-ranked grid blocks as a candidate for placement of a sensor to increase emission inventory accuracy for the given geographic area;

wherein the method is carried out by at least one computing device.

* * * * *